United States Patent
Basol et al.

(10) Patent No.: US 6,967,166 B2
(45) Date of Patent: Nov. 22, 2005

(54) METHOD FOR MONITORING AND CONTROLLING FORCE APPLIED ON WORKPIECE SURFACE DURING ELECTROCHEMICAL MECHANICAL PROCESSING

(75) Inventors: Bulent M. Basol, Manhattan Beach, CA (US); Jeffrey A. Bogart, Los Gatos, CA (US); Efrain Velazquez, San Jose, CA (US)

(73) Assignee: ASM Nutool, Inc., Fremont, CA (US)

( * ) Notice: Subject to any disclaimer, the term of this patent is extended or adjusted under 35 U.S.C. 154(b) by 602 days.

(21) Appl. No.: 10/122,646

(22) Filed: Apr. 12, 2002

(65) Prior Publication Data

US 2003/0194866 A1    Oct. 16, 2003

(51) Int. Cl.⁷ .......................................... H01L 21/4763
(52) U.S. Cl. .................... 438/691; 438/692; 438/633
(58) Field of Search ................................ 438/691, 692, 438/693, 689, 631, 633

(56) References Cited

U.S. PATENT DOCUMENTS

| | | | |
|---|---|---|---|
| 5,876,266 A * | 3/1999 | Miller et al. .................. | 451/36 |
| 2001/0024881 A1 * | 9/2001 | Hofmann et al. ........... | 438/692 |
| 2002/0052052 A1 * | 5/2002 | Robinson et al. ............. | 438/5 |
| 2002/0069967 A1 * | 6/2002 | Wright .................. | 156/345.12 |
| 2003/0124855 A1 * | 7/2003 | Feller et al. ................ | 438/692 |

* cited by examiner

*Primary Examiner*—Thanh Nguyen
(74) *Attorney, Agent, or Firm*—Knobbe Martens Olson & Bear LLP

(57) ABSTRACT

In one aspect, the present invention monitors a signal corresponding to a torque value of a motor that is used to maintain relative motion between a conductive top surface of a workpiece and a workpiece surface influencing device in the presence of physical contact between the conductive top surface of the workpiece and the workpiece surface influencing device. In another aspect, the present invention uses the signal to control a force applied to a top conductive surface of a workpiece during electrotreatment.

39 Claims, 4 Drawing Sheets

METHOD FOR MONITORING AND CONTROLLING FORCE APPLIED ON WORKPIECE SURFACE DURING ELECTROCHEMICAL MECHANICAL PROCESSING

BACKGROUND OF THE INVENTION

1. Field of the Invention

The present invention relates to manufacture of semiconductor integrated circuits and, more particularly to a method for planar deposition or etching of conductive layers.

2. Description of the Related Art

Conventional semiconductor devices generally include a semiconductor substrate, such as a silicon substrate, and a plurality of sequentially formed dielectric interlayers such as silicon dioxide and conductive paths or interconnects made of conductive materials. Copper and copper alloys have recently received considerable attention as interconnect materials because of their superior electro-migration and low resistivity characteristics. The interconnects are usually formed by filling copper in features or cavities etched into the dielectric layers by a metallization process. The preferred method of copper metallization is electroplating. In an integrated circuit, multiple levels of interconnect networks laterally extend with respect to the substrate surface. Interconnects formed in sequential layers can be electrically connected using vias or contacts.

In a typical process, first an insulating layer is formed on the semiconductor substrate. Patterning and etching processes are performed to form features such as trenches and vias in the insulating layer. Then, a conductor such as copper is electroplated to fill all the features. However, the plating process results in a thick copper layer on the substrate, some of which need to be removed before the subsequent step. Conventionally, after the copper plating, CMP process is employed to globally planarize and then reduce the thickness of the copper layer down to the level of the surface of the barrier layer, which is later also removed. CMP is a costly and time consuming process that reduces production efficiency. High pressures used in the CMP processes also damage low-k dielectrics that are mechanically weaker than the silicon oxide.

The adverse effects of conventional material removal technologies may be minimized or overcome by employing an Electrochemical Mechanical Processing (ECMPR) approach that has the ability to provide thin layers of planar conductive material on the workpiece surface, or even provide a workpiece surface with no or little excess conductive material. This way, CMP process can be minimized or even eliminated. The term of Electrochemical Mechanical Processing (ECMPR) is used to include both Electrochemical Mechanical Deposition (ECMD) processes as well as Electrochemical Mechanical Etching (ECME), which is also called Electrochemical Mechanical Polishing (ECMP). It should be noted that in general both ECMD and ECME (or ECMP) processes are referred to as electrochemical mechanical processing (ECMPR) since both involve electrochemical processes and mechanical action on the workpiece surface.

Descriptions of various planar deposition and planar etching methods i.e. ECMPR approaches and apparatus, can be found in the following patents and pending applications, all commonly owned by the assignee of the present invention: U.S. Pat. Ser. No. 6,126,992 entitled "Method and Apparatus for Electrochemical Mechanical Deposition," U.S. application Ser. No. 09/740,701 entitled "Plating Method and Apparatus that Creates a Differential Between Additive Disposed on a Top Surface and a Cavity Surface of a Workpiece Using an External Influence," filed on Dec. 18, 2001, and U.S. application filed on Sep. 20, 2001 with Ser. No. 09/961,193 entitled "Plating Method and Apparatus for Controlling Deposition on Predetermined Portions of a Workpiece". U.S. application with Ser. No. 09/960,236 filed on Sep. 20, 2001, entitled "Mask Plate Design," and U.S. Provisional Application with serial No. 60/326,087 filed on Sep. 28, 2001, entitled "Low Force Electrochemical Mechanical Processing Method and Apparatus," both assigned to the same assignee as the present invention. These methods can deposit metals in and over cavity sections on a workpiece in a planar manner.

FIG. 1 shows an exemplary ECMPR system 10, which includes a workpiece-surface-influencing device (WSID) 12 such as a mask, pad or a sweeper, a carrier head 14 holding a workpiece 16 such as a wafer, and an electrode 18. The wafer can be a silicon wafer to be plated with copper using the ECMPR system or it can be a copper plated wafer to be electro-etched using the ECMPR approach. The WSID 12 is used during at least a portion of the ECMPR when there is physical contact and relative motion between a surface 20 of the wafer 16 and the top surface 22 of the WSID 12. During ECMPR, A top surface 22 of the WSID sweeps the surface 20 of the wafer 16 while an electrical potential is established between the electrode 18 and the surface of the wafer. Alternately, in some cases potential is established right after WSID surface 22 sweeps the surface 20 of the wafer. In other words establishment of the potential and sweeping of the substrate surface by the WSID do not have to be simultaneous or continuous as described in detail in previous applications cited above. Channels 24 of the WSID allow a process solution 26 such as a copper plating electrolyte to flow to the surface of the wafer. The WSID is basically composed of a top layer 28, which is preferably made of a flexible film, and a compressible layer 30 that is made of a spongy or otherwise compressible material. The top layer 28 and the compressible layer 30 may themselves be composite layers, i.e. they may consist of one or more layers of different materials. The top layer 28 may be an abrasive film. The WSID is supported by a rigid support plate 32 which is porous, or otherwise has set of openings to direct the process solution towards the surface of the workpiece surface through the WSID structure.

If the ECMD process is carried out to plate a conductor such as copper onto the wafer in the ECMPR system of FIG. 1, the surface of the wafer is wetted by a deposition electrolyte which is also in fluid contact with an electrode (in this case an anode), such as electrode 18 shown in FIG. 1, and a potential is applied between the surface of the wafer and the electrode rendering the wafer surface cathodic. If the ECME process is carried out, the surface of the wafer is wetted by the deposition electrolyte or a special etching electrolyte, which is also in fluid contact with an electrode (this time the cathode) and a potential is applied between the surface of the wafer and the electrode rendering the wafer surface anodic. Thus etching takes place from the wafer surface.

The ECMPR systems are capable of performing planar or non-planar plating as well as planar or non-planar electro-etching. If non-planar process approach is chosen, the front surface of a wafer is brought near the top flexible layer of the WSID, but it does not touch it, so that non-planar metal deposition can be performed. Further, if planar process approach is chosen, the front surface of the wafer contacts the top flexible layer, at least during a portion of the process period, as a relative motion is established between the top layer and the wafer surface. As an electrolyte solution is delivered through the channels of the WSID, the wafer is moved, i.e., rotated and preferably also laterally moved, while the front surface contacts the flexible layer. Under an applied potential between the wafer and an electrode, and in the presence of the process solution, the metal such as copper, is plated on or etched off the front surface of the wafer depending on the polarity of the voltage applied between the wafer surface and the electrode. During the process, the wafer surface is pushed against the surface of the WSID or vice versa at a pressure range of about 0.1–2 psi, preferably at a range of 0.1–1 psi, at least part of the time when the surface of the workpiece is swept by the WSID. Planar deposition is achieved due to this sweeping action as described in the above-cited patent applications. It should be noted that even higher pressures may be applied to the substrate surface by the WSID in applications where high stress does not cause damage on the surface of the substrate. It should also be noted that although the invention is described as it is applied to manufacturing of interconnects on wafers, it is applicable to all cases where cavities on a substrate is filled with a planar conductor material. Although a specific WSID structure is given to describe the invention, the invention is applicable to any WSID design or structure as long as the WSID is used to contact the workpiece surface during at least some portion of the deposition or etching process.

The amount of force that is applied on the wafer during ECMPR affects the characteristics of the deposited layer. This physical contact needs to be uniform and repeatable for best results. For example, during planar deposition of copper layers, if the wafer is pushed against the top flexible layer, the force on the wafer is increased as the compressible layer is compressed more and more toward the support layer. For many compressible layer materials, the force exerted onto the wafer surface increases roughly linearly as the wafer is pushed into the WSID from a 'zero-touch' position in which the wafer surface just touches the WSID surface. For example, for a selected compressible layer material with certain spring constant, pushing the wafer into the WSID by 0.5 mm may apply an average force of 0.3 psi onto the wafer surface. Increasing the pushing distance to 1 mm may increase the force to approximately 0.6 psi. For other materials this relationship may not be linear but it may show a sub-linear or super-linear behavior. In any case, it can be appreciated from the above discussion that the stability of the ECMPR over hundreds or thousands of wafers may require a knowledge of the "zero-touch" position, the amount of push or displacement by the wafer surface into the WSID, or the force applied onto the wafer surface.

Conventionally, the touch position is determined during the set-up of the ECMPR equipment after installation of a new WSID or any time a change is made in the set-up that may have affected the zero-touch position. The touch position can be determined, for example, by placing a thin (typically 2–4 mils thick) sheet between the wafer surface and the WSID. The gap between the wafer surface and the WSID is then gradually reduced through commands to the z-motion controller and z-motion motor typically at 0.1 mm increments. As the wafer surface is brought closer and closer to the WSID surface the thin sheet in between the two surfaces is continually moved. When the zero-touch position is reached the sheet cannot be easily moved any more indicating that the WSID surface is pushed against the wafer surface. This procedure is time consuming and not necessarily accurate.

Once the zero-touch position is determined and recorded, the ECMPR recipe then commands a vertical, or z-motion, controller of the wafer holder 14 to push the wafer into the WSID during the process, by a fixed amount relative to this recorded zero-touch value, the amount of displacement corresponding to the desired level of force on the wafer surface. For example, zero-touch position may correspond to a reading of 30.55 mm (a position that is measured with respect to a surface under the WSID of FIG. 2, for example with respect to the top of the layer 125*c*) on the z-position indicator. If during ECMPR, z-position controller asks the z-position motor to bring the wafer surface down to a z displacement position of 30.05 mm, this will mean that the wafer surface is pushed into the WSID by an amount of 0.5 mm which may correspond to a force of 0.5 psi depending upon the characteristics such as the spring constant of the compressible layer.

There are, however, drawbacks in this approach. For example, during processing of plurality of wafers with the same WSID, the compressible layer of the WSID may swell or shrink due to exposure to the process solutions, and this may cause the "z" position of the WSID surface to change in time from the value set during the initial set up, which in turn may result in wafer to wafer variations in zero touch position. Soaking of the compressible layer 30 in process solution for long periods of time may also change the spring constant of this layer. In other words the force applied to the wafer surface may not be the same for the same displacement or push value after the WSID is soaked in the process solution. Also, if the WSID is replaced, the height of the WSID or the distance between the WSID and the wafer surface may change due to the possible thickness variation from batch to batch of the compressible layer of the WSID. This may result in variations in zero touch positions for the wafers processed before and after the replacement. As explained above, variations in the zero touch position may result in changes in the force that is exerted on the wafers during the process. It may also cause changes in the distance between the WSID surface and the wafer surface during no-touch deposition. Furthermore, changes in the properties of the compressible layer or the top layer of the WSID may result in changes in the force applied to the wafer surface even for the same displacement of the wafer surface into the WSID structure. Such process non-uniformity is not desirable in the semiconductor industry.

To this end, there is need for an improved method and apparatus for monitoring and controlling the force applied to the surface of substrates during planar metal electrochemical mechanical deposition or electro-etching.

SUMMARY OF THE INVENTION

It is an advantage of the present invention to obtain a more uniform electrotreatment process.

It is a further advantage of the present invention to provide a more uniform electrotreatment process when sequentially processing a plurality of workpieces using the same electrotreatment apparatus.

It is a further advantage of the present invention to provide a desired force between a conductive top surface of a workpiece and a workpiece surface influencing device during electrotreatment of the workpiece.

It is a further advantage of the present invention to monitor a torque of a motor that is used to maintain relative motion between a conductive top surface of a workpiece and a workpiece surface influencing device in the presence of physical contact between the conductive top surface of the workpiece and the workpiece surface influencing device.

It is a further advantage of the present invention to control a force applied to a top conductive surface of a workpiece during electrotreatment.

Certain of the above advantages, either singly or in combination, are achieved by the present invention. In one aspect, the present invention monitors a signal corresponding to a torque value of a motor that is used to maintain relative motion between a conductive top surface of a workpiece and a workpiece surface influencing device in the presence of physical contact between the conductive top surface of the workpiece and the workpiece surface influencing device.

In another aspect, the present invention uses the signal to control a force applied to a top conductive surface of a workpiece during electrotreatment.

BRIEF DESCRIPTION OF THE DRAWINGS

The above and other aspects, features, and advantages of the present invention are further described in the detailed description which follows, with reference to the drawings by way of non-limiting exemplary embodiments of the present invention, wherein like reference numerals represent similar parts of the present invention throughout several views and wherein.

DETAILED DESCRIPTION OF THE PREFERRED EMBODIMENTS

As will be described below, the present invention provides a force monitoring system and method for ECMPR techniques that use a WSID for processing wafers. The force monitoring system of the present invention monitors variations in the motor current or torque of the carrier head to monitor and, if desired, control the force on the wafers. By processing wafers at the same torque level, without regard to zero-touch position or displacement values, each wafer is processed with the same amount of force applied to its surface irrespective of possible changes that may take place in the material characteristics of the WSID. The present invention can be used in the initial set up of the ECMPR equipment. The invention also measures, monitors and if desired, controls, the force applied on wafers to ensure uniform processing of each wafer at the same force level, regardless of changes in zero touch position or materials properties of the WSID.

Figure 1:
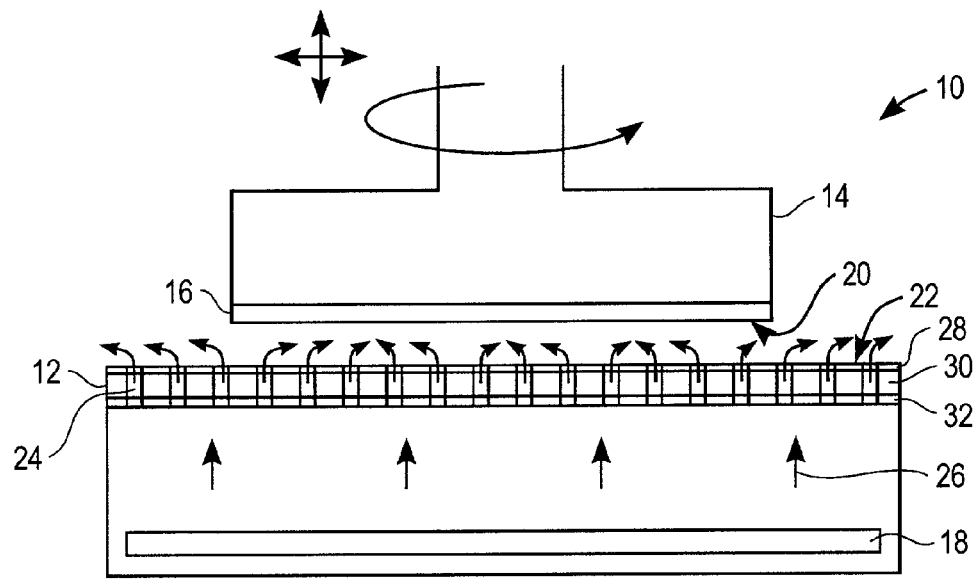
FIG. 1 shows an exemplary ECMPR system.
Figure 2:
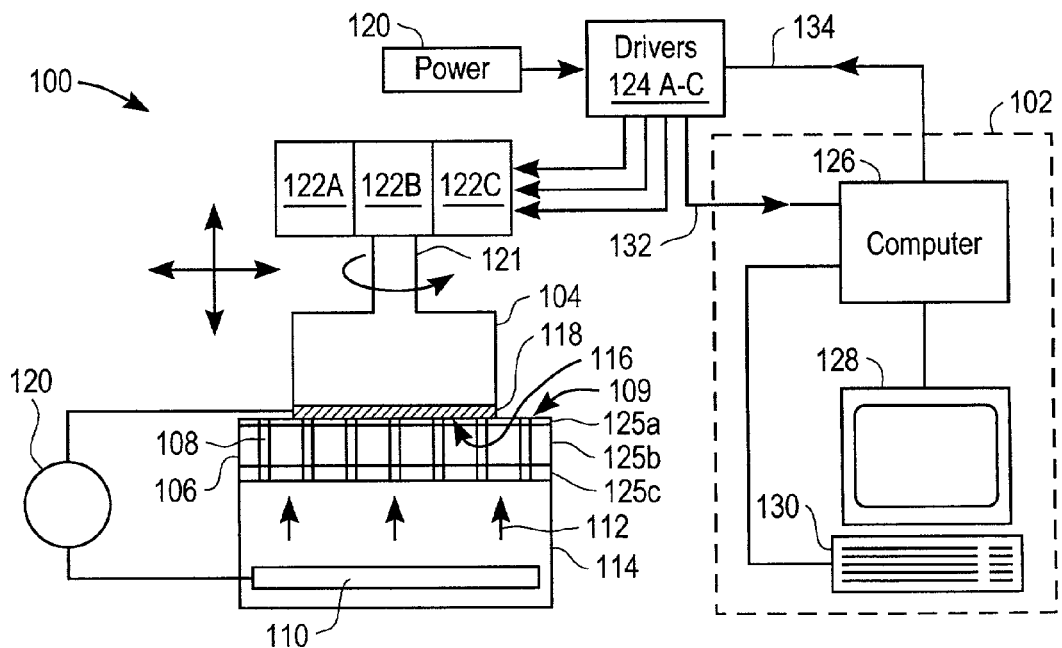
FIG. 2 illustrates an ECMPR system with a force monitoring and control system according to the present invention.

FIG. 2 illustrates an ECMPR system 100 having an exemplary force monitoring station 102. The system 100 comprises a carrier head 104, a WSID 106 having channels 108 and a surface 109. One carrier head design which is especially suited for use to practice the present invention is disclosed in U.S. provisional application with Ser. No. 60/326,087 filed on Sep. 28, 2001, entitled "Low Force Electrochemical Mechanical Processing Method and Apparatus," assigned to the assignee of the present invention. The system also comprises an electrode 110 immersed in a process solution 112 (typically an electrolyte in the case of ECMD or an electrolyte or an electropolishing etching solution containing no slurry in the case of ECME) which is contained in a container 114. A wafer 118 with a front surface 116, typically a conductive front surface, to be processed is held by the carrier head 104. Electrode 110 and the front side of the wafer are electrically connected to the opposite terminals of power supply 120 during processing. The wafer 118 may be a preprocessed silicon wafer having features or cavities such as vias or trenches lined with a barrier layer and a copper seed layer. The carrier head 104 can be rotated by a shaft 121 that is connected to a spindle motor 122A (preferably using a servo motor), moved in a z-direction using a z-drive or vertical drive motor 122B (preferably using a stepper motor), and also, preferably can be moved in a lateral or y-direction using a y-drive or lateral drive motor 122C (preferably using a stepper motor). It is noted that the specific location of each of the motors 122A, 122B and 122C is not illustrated in FIG. 2, but these motors are shown in block form to illustrate each of their inclusion in the system 100. Power from power supply 20, which will be at the appropriate level for each respective motor 122, is supplied to a respective one of drivers 124A–C, which drivers 124A–C are used to determine the power supplied to each motor 122 based upon signals supplied from the force monitoring unit 102. Signals are provided from each of the respective drivers 124 that provide feedback information relating to the torque of the resspective motor. These signals are used by the force monitoring unit. 102 as described hereinafter along lines 132.

The WSID is comprised of a top layer 125a, an intermediate layer 125b and a support plate 125c. The top layer is made of a flexible material and preferably has an abrasive hard surface. The intermediate layer is a compressible layer made of a material such as polyurethane foam. Examples of various WSID designs which are suited for use to practice the present invention are also disclosed in above cited U.S. provisional application with Ser. No. 60/326,087 filed on Sep. 28, 2001, entitled "Low Force Electrochemical Mechanical Processing Method and Apparatus," assigned to the assignee of the present invention.

As illustrated in FIG. 2, the force monitoring unit 102 may comprise a computer 126 with a CPU (not shown) and a memory unit (not shown), a monitor 128 and input devices such as a keyboard 130 or a pointing device (not shown). The force monitoring unit 102 shown in FIG. 2 is simplified for the purpose of clarification, its components and the location and other features may vary and such variations are within the scope of this invention. The computer may run a suitable process monitoring and control software. The computer 126 may receive input signals along signal lines 132 from the drivers 124A–C (in the preferred embodiment from motor 122A as described hereinafter) relating to the torque value of the various motors 122A–C, which signals typically correspond to the current drawn from respective motor. The output signal lines 134 may carry control signals indicating the direction of movement (clockwise or counterclockwise in the case of a stepper motor used for spindle motor 122A, or up or down counts in the case of a stepper motor used for motors 122B and 122C) and the amount of electrical current or power (typically amount of torque in the case of a servo motor used for spindle motor 122A or acceleration in the case of a stepper motor used for motors 122B and 122C) that is used by each of the drivers 124A–C to determine the appropriate power that gets supplied to each of the motors 122.

In addition to using the output signals along signal lines 134 during actual processing, the output signals along signal lines 134 may contain commands that will result in the various motors 122 performing a a test to check the current zero touch position and adjust the amount the wafer 118 is pushed into the WSID. As during other processing, signals provided along lines 132 that can then be monitored by the force monitoring unit 102, including current data that can be transformed into torque values to observe changes in, for example, carrier head motor torque, throughout the test process. This test may be conducted at the beginning of the process and may be repeated at intervals during the process. The input signals along lines 132 including current data to computer 126 may be transformed into torque values or may alternatively already represent the torque values, to observe changes in carrier head motor torque throughout the process time.

Figure 3:
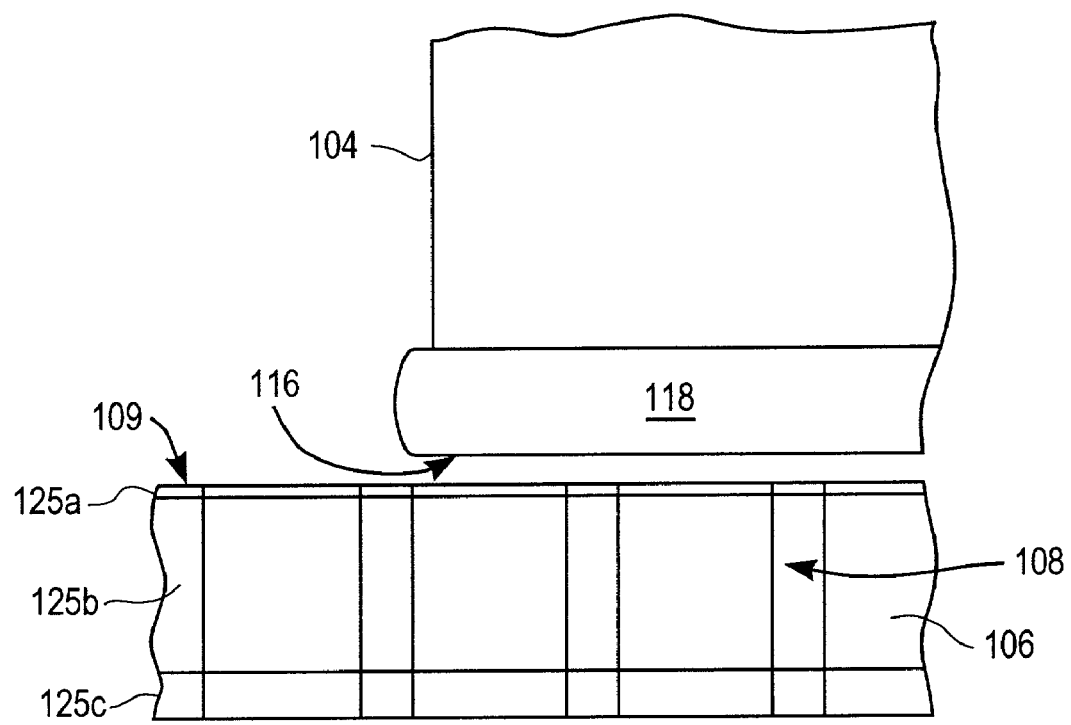
FIG. 3 shows a portion of the ECMPR system with a wafer being operated upon in close proximity to a workpiece surface influencing device.
Figure 4:
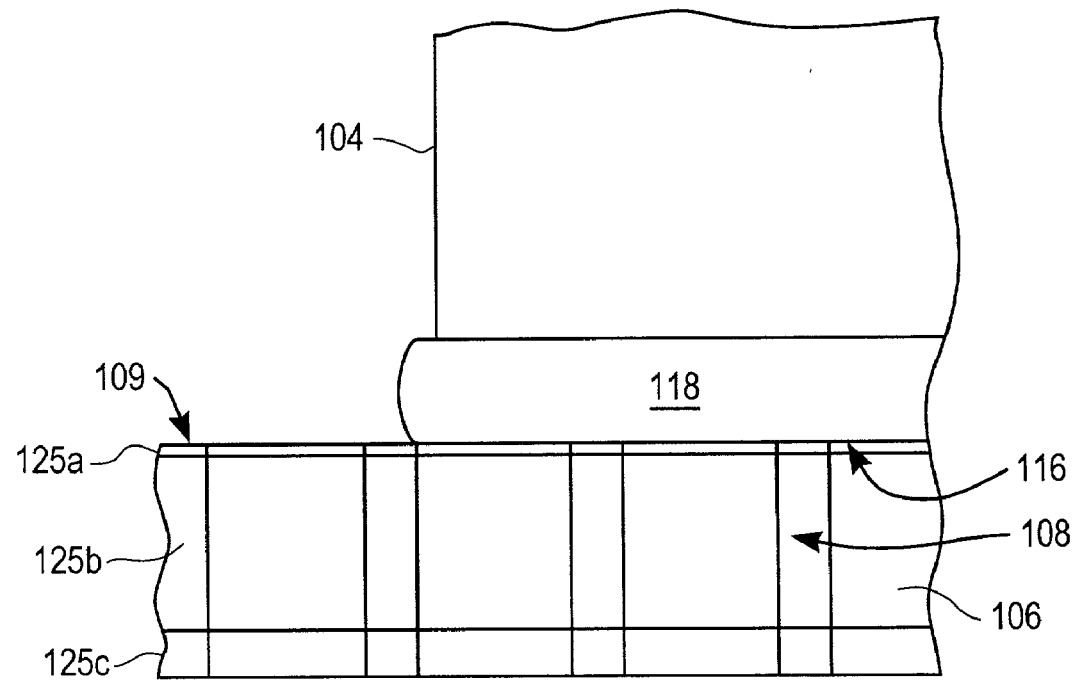
FIG. 4 shows an electrotreatment process stage when a workpiece is brought into an initial touch position according to the present invention.
Figure 5:
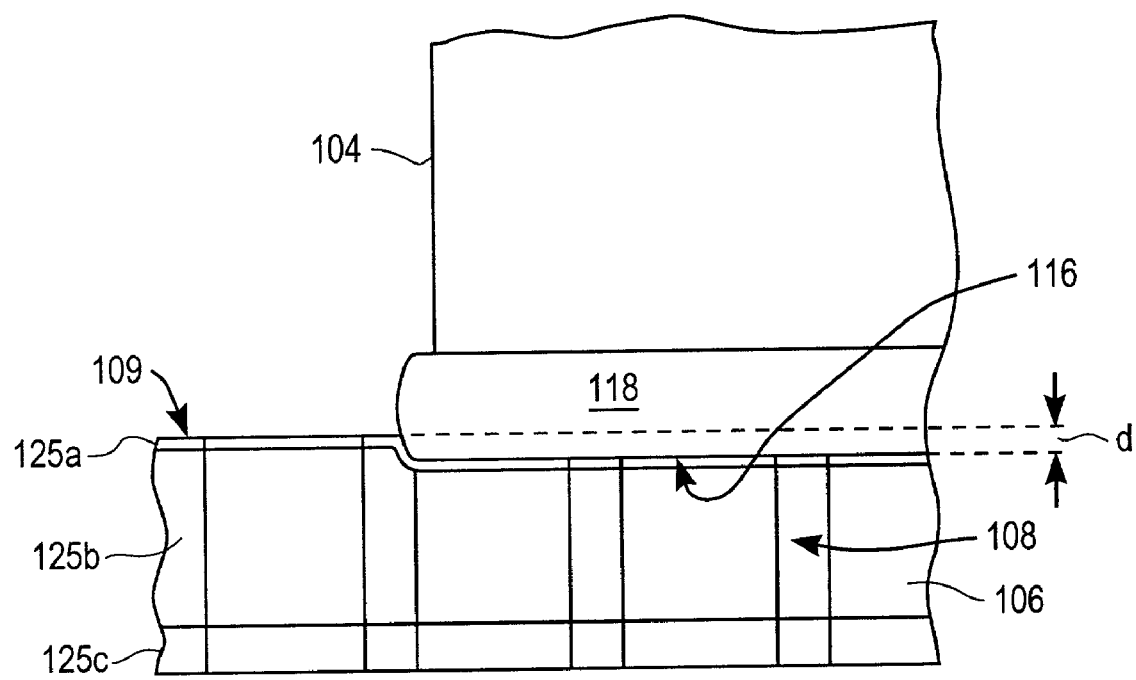
FIG. 5 shows a touch stage of the electrotreatment process according to the present invention.
Figure 6:
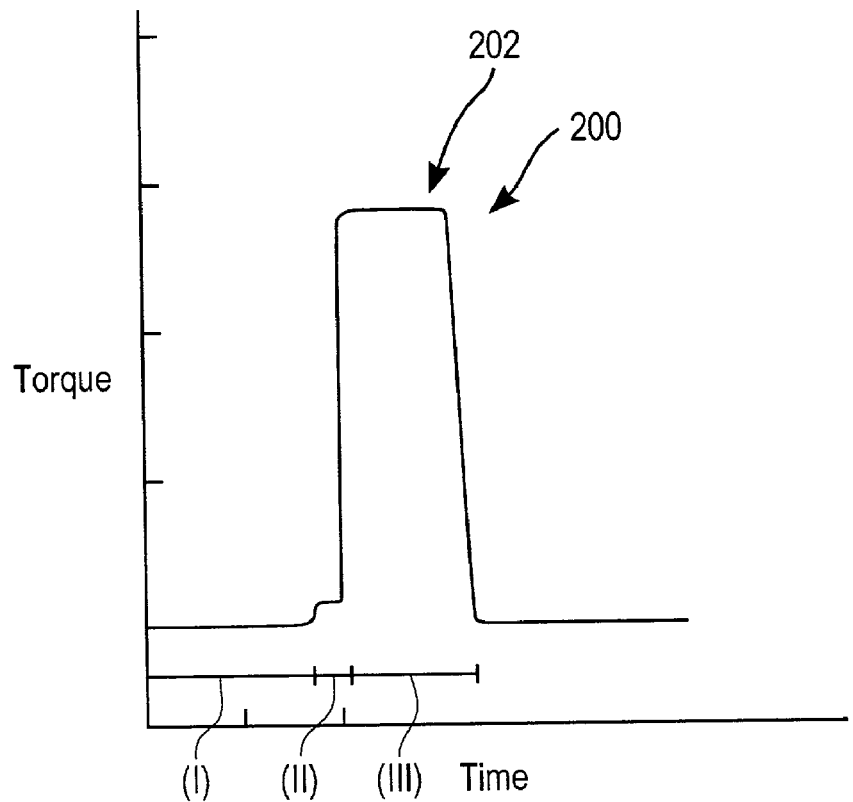
FIG. 6 illustrates an exemplary graph of torque readings versus time during a process having stages of no-touch, zero-touch, and touch according to the present invention.

FIGS. 3–5 describe the process of the present invention with help of an exemplary graph 202 in FIG. 6 which shows torque readings versus time during a process having stages of no-touch (I), zero-touch (II) and a touch (III).

FIG. 3 shows a portion of the system 100, shown in FIG. 2, in which the wafer 118 is in close proximity of the WSID. At this stage the vertical distance between the wafer and the WSID may be approximately 0.5–5 millimeters. Since there is no physical contact between the wafer and the WSID, the torque reading shown with graph 200 in FIG. 6 is assumed zero through out the no-touch stage (I). It should be noted that in actual practice there will be a torque reading. However, this reading will be taken as the reference reading which will be assumed as zero for calibration purposes.

FIG. 4 shows the stage when the wafer is brought to the initial touch position or zero-touch position on the WSID surface 109. At this stage, the gap between the wafer surface 116 and the surface of the WSID is zeroed, while the wafer is rotated or otherwise moved. In response to contact and resulting frictional force between the surface 116 of the wafer and the surface 109 of the WSID, the torque value is suddenly increased. This is shown in FIG. 6 in graph 200 in zero-touch stage (II) as a short steep climb followed by a plateau in torque value. The z position of the carrier head when torque changes in stage II is registered by the computer 126 of the force monitoring unit 102 as the zero touch position.

FIG. 5, shows the touch stage of the process where the wafer 118 is pressed onto the WSID while the wafer is being rotated and possibly translated at the same time. At this stage, the wafer is pushed or pressed down by a predetermined depth into the WSID, which is denoted with 'd'. FIG. 6 shows the abrupt change in torque value in the touch stage (III), as the wafer is pressed down to the depth 'd'. Once the depth 'd' is reached, the force applied on the wafer reaches its predetermined value for that depth d. Alternately, the torque value may be pre-determined and the wafer is pressed down slowly to get the pre-determined value of the torque.

Once the required torque value is reached the carrier head z motion is stopped. In any case both the 'd' value and the corresponding torque value may be registered by the computer 126 of the monitoring unit 102. If a plurality of wafers is to be processed, wafers following the first wafer may be processed using the same registered torque value that was obtained for the first wafer. This provides repeatability for the process. However, as explained above in the background section, during the process, zero-touch position of the wafer may also change. This, in turn, may change the spacing between the wafer surface and the WSID surface during the non-touch plating step. It is, therefore, preferable to at least occasionally adjust the zero-touch position during processing.

In one embodiment the system of FIG. 2 may be used to initially setup the ECMPR system. In other words the zero-touch position can be determined during the initial set-up. This can be achieved in two ways. In manual approach the wafer, preferably a set-up wafer, may be moved (preferably rotated) as the torque value is monitored. Then wafer may be incrementally lowered towards the WSID by manually controlling the z-motion motor, through for example a switch. When the torque value shows a sudden increase indicating contact between the wafer surface and the WSID surface, z motion is stopped, or switched off, and the z reading is taken as the zero-touch position. Alternately, in the automatic mode, the sudden change in the torque is sensed by the electronics and z motion is automatically stopped and the z value for zero-touch position is registered by the computer. Once the zero touch position is determined process can be run by placing the wafer surface above the WSID by a pre-determined amount (e.g. 2 mm) for no-touch plating or by pushing the wafer surface into the WSID by a pre-determined amount (e.g. 1 mm) for ECMPR. The system in FIG. 2 may also be used to automatically determine the zero touch position at constant intervals throughout processing several wafers.

In the case of position-based control described above, the system is used to periodically monitor and adjust the zero-touch position and place the wafer surface by pre-determined distance (dictated by the process recipe) above or below this zero-touch position. It is understood that during the set up stage, the present invention is used to determine where the zero-touch position is. After the initial determination, the carrier head is moved up or down by a predetermined (by the process recipe) distance to carry out either no-touch or touch ECMD or ECME process. As described above, the force monitoring unit 102 periodically determines the zero-touch position.

In another embodiment, the present invention performs torque-based control. In this embodiment, the process recipe contains the desired torque values for the electrochemical mechanical processing, and also the desired distance from the WSID surface the workpiece is to be processed during a possible non-contact or no-touch processing step. In this case, the zero-touch position is determined as before. Then the wafer may be placed by the z-motor control by the predetermined amount (dictated by the process recipe) above the WSID surface and non-contact processing can be carried out. For processing in contact mode or touch mode, the wafer is moved towards the WSID and then pushed into the WSID structure as the force monitoring unit 102 monitors the torque. When the desired torque value dictated by the process recipe is reached, the force monitoring unit 102 stops the z motion and wafer processing is carried out at this desired torque value. It should be noted that the torque value is related to the frictional force between the wafer surface and the WSID surface, which in turn is related to the force applied by the WSID structure onto the wafer surface. Throughout the process, this frictional force value can be kept relatively constant on the wafers by automatic adjustment of the vertical displacement 'd' by the force monitoring unit 102. This way a plurality wafers can be processed under similar conditions despite any changes that may be taking place in the properties of the WSID. As the discussion above shows, the present invention may be used for just monitoring zero-touch position and frictional force on the wafer surface. It may also be used for actively controlling the frictional force on the wafers.

It should be noted that this invention is also useful in evaluating different WSID surfaces in terms of frictional force that they apply to the wafer surface. Depending on the friction coefficient of the material of the top layer 125a of the WSID, even for the same 'd' value, the frictional force on the wafer surface may change. For example, for the same displacement value or 'd' value, materials with low friction coefficients may yield lower torque values than the materials with higher friction coefficients.

As an example let us assume that plurality of wafers such as 500 wafers will be processed by an ECMD system using a process recipe that calls for a first process period t1 of no-touch copper plating on the wafer surface with wafer surface 1 mm above the surface of the WSID. This step may be, for example, used to fill substantially all the features with at least one dimension less than about 0.5 um with copper. The process recipe may then call for a second process period t2 during which time planar deposition of copper may take place on the wafer surface. Let us assume that this planar deposition step requires the surface of the wafer to be pushed into the WSID structure by 0.5 mm, which may correspond to a force of 0.5 psi being applied to the wafer surface for that specific WSID structure. Let us also assume that a brand new WSID is installed in the system for processing this plurality of wafers. It would be beneficial to process all the wafers under substantially the same conditions, i.e. first at a distance 1 mm away from the WSID surface, then during planar deposition at a relatively constant force applied to the wafer surface. There are two approaches to be taken as will be described below:

If the WSID structure is stable for a predetermined period of time necessary to process the plurality of wafers, the initial zero-touch position preferably should be determined after installing the WSID. The predetermined time period may be the time required to process certain number of wafers without replacing the WSID or re-determining its zero-touch position. Initially, a setup wafer is held in close proximity of the WSID (see FIG. 3). During this initial stage the wafer is being rotated and the torque value is registered as zero. Then, the wafer is lowered on the WSID and the z position when the torque suddenly changes is recorded as the zero-touch position. From this point on the set up is considered complete and the plurality of wafers can be processed by placing their surface by 1 mm above this predetermined zero-touch position and then 0.5 mm below it.

In practice, even if the spring constant of the compressible layer in the WSID structure may not change with time, there may be some swelling of it in the process solution. This may change the zero-touch position in time. Therefore, the zero-touch position may be periodically checked by the system of FIG. 2. This can be achieved by inserting a set-up wafer into the process periodically, for example after every 50 wafer processing, and determining the zero-touch position as described above.

Alternately during the process the $n^{th}$ wafer, such as the $50^{th}$, that is already processed may be used to check the zero-touch position as follows. Consider the case the wafer is processed by first a non-touch plating step followed by a touch plating step. After the touch plating step, the z position of the wafer surface may be slowly changed, for example reducing "d" at 0.05 or 0.1 mm intervals while rotating the wafer and monitoring the torque value. The torque value is expected to decrease towards zero. The z value when the torque reaches zero or near-zero is the zero-touch position which may be recorded as the new zero-touch position to be used for the next 50 wafer processing.

If the WSID structure is unstable (both the spring constant and thickness of the compressible layer changing) for the period of time necessary to process a plurality of wafers, force-based or torque-based control is necessary. As an example let us assume that a plurality of wafers, such as 500 wafers, will be processed by an ECMD system using a process recipe that calls for a first process period t1 of no-touch copper plating on the wafer surface with wafer surface 1 mm above the surface of the WSID. This step may be, for example, used to fill substantially all the features with at least one dimension less than about 0.5 um with copper. The process recipe may then call for a second process period t2 during which time planar deposition of copper may take place on the wafer surface. Let us assume that this planar deposition step requires the WSID structure to apply a pressure of 0.5 psi on the wafer surface, which may correspond to a pre-determined torque value of "Q" for that specific WSID structure. Let us also assume that a brand new WSID is installed in the system for processing this plurality of wafers. It would again be beneficial to process all the wafers under substantially the same conditions, i.e. first at a distance 1 mm away from the WSID surface, then during planar deposition at a constant torque value "Q" which corresponds to a relatively constant pressure of 0.5 psi applied to the wafer surface.

Initially, a setup wafer is held in close proximity of the WSID (see FIG. 3). During this initial stage the wafer is being rotated and the torque value is registered as zero. Then, the wafer is lowered on the WSID using the z-drive motor 122B and the z position when the torque suddenly changes is recorded as the zero-touch position. From this point on the set up is considered complete and the plurality of wafers can be processed by placing their surface by 1 mm above this predetermined zero-touch position to carry out the non-touch process step. For the touch process step, the wafer surface is slowly pushed into the WSID structure by the z-motor 122B and z-motor control as the torque value is monitored by system 102 of FIG. 2. When the torque value reaches "Q" z motion is stopped and process commences. During process, the torque value "Q" is kept constant through continuous monitoring and feedback loop that adjusts the z-position to keep the torque value constant. In this approach the zero-touch position should also be continually or periodically monitored and adjusted as explained before. The torque value is monitored and controlled for each wafer assuring process stability and repeatability.

While the torque value for the spindle motor 122A that rotates the carrier head 104 is discussed above as being used for purposes of monitoring torque, it should be understood that the lateral or y-drive motor 122C can also be for monitoring torque, although monitoring from such motors will typically not provide as sensitive a measurement as from the spindle motor 122A.

It should be noted that the invention is described by giving as an example the WSID structure which is especially suited for a low-force ECMPR approach as disclosed in U.S. Provisional Application with Ser. No. 60/326,087 filed on Sep. 28, 2001, entitled "Low Force Electrochemical Mechanical Processing Method and Apparatus," assigned to the same assignee as the present invention. However, it should be appreciated that the invention is applicable to any ECMPR approach that uses a workpiece and a WSID. For example, processes using rigid WSID structures can also be monitored and controlled by the present invention. In this case the workpiece holder may be, for example, a gimballing type as disclosed in patent application U.S. application Ser. No. 09/472,523 filed Dec. 27, 1999 entitled "Work Piece Carrier Head For Plating or Polishing" or as described in Ser. No. 09/910,686 filed Jul. 20, 2001 entitled "Method of Sealing a Wafer Backside for Full-Face Electrochemical Plating and the force between the workpiece surface and the WSID surface is determined by the pressure exerted by the workpiece holder onto the back surface of the wafer pushing it against the WSID surface. In this case the invention may be used to determine and control the zero-touch position. It also can monitor the torque from the workpiece holder motor and adjust the pressure exerted by the workpiece holder against the WSID structure to keep this torque value constant.

Figure 7:
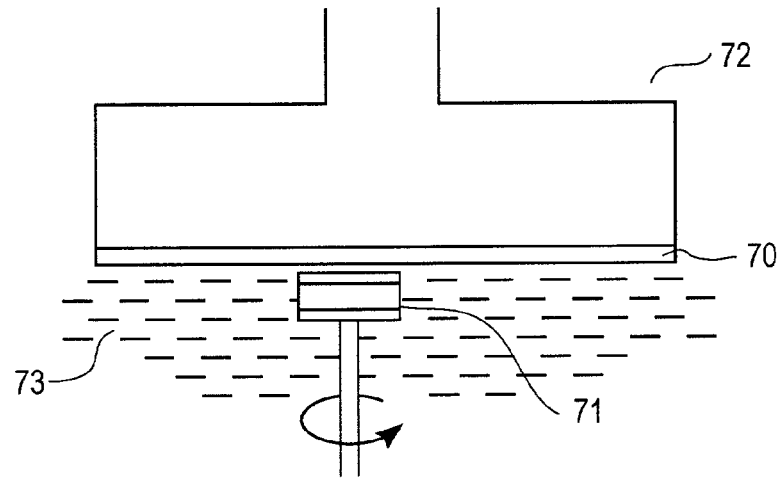
FIG. 7 illustrates another illustrative embodiment of a portion of an ECMPR system according to the present invention.

Similarly the invention is described in terms of a stationary WSID and moving workpiece where the monitoring of torque is done from the motor that moves (rotates) the workpiece. It is, however, possible to carry out ECMPR using stationary workpiece and moving WSID or even using moving workpiece and moving WSID. As an example refer to FIG. 7 where a workpiece holder 72 holds the workpiece 70 in contact with a process solution 73. The WSID 71 is smaller than the workpiece 70 and it has the capability to rotate. Zero-touch position and the frictional force monitoring and control in this case may be done monitoring the torque value of the motor (not shown) rotating the WSID 71. It should also be noted that ECMPR does not necessarily need rotation. It just needs relative motion between the workpiece surface and a WSID (see e.g. U.S. application Ser. No. 09/740,701 entitled "Plating Method and Apparatus that Creates a Differential Between Additive Disposed on a Top Surface and a Cavity Surface of a Workpiece Using an External Influence," filed on Dec. 18, 2001, and U.S. Application filed on Sep. 20, 2001 with Ser. No. 09/961,193 entitled "Plating Method and Apparatus for Controlling Deposition on Predetermined Portions of a Workpiece"). In any case, torque can be monitored and used as described in this application from any motor providing any motion to the WSID and/or to the wafer surface.

Figure 8:
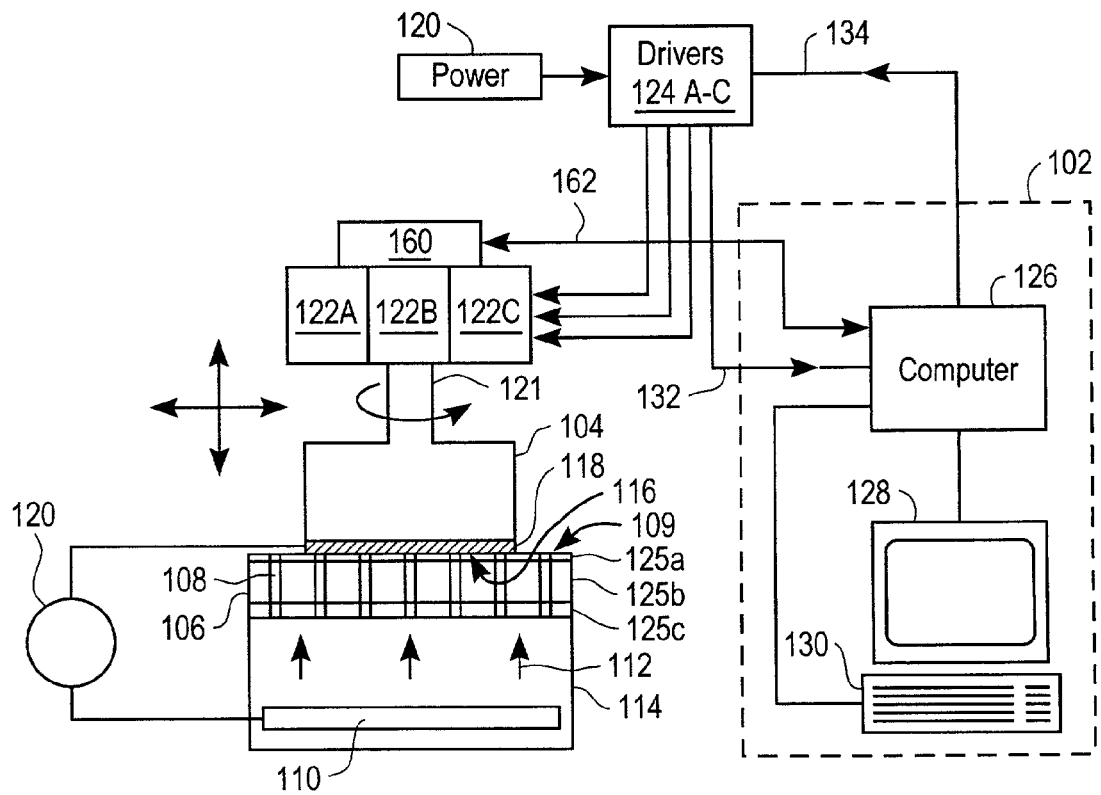
FIG. 8 illustrates another embodiment of the present invention that alters pressure on a backside support within a wafer carrier head to change the applied force.

FIG. 8 illustrates another embodiment of the present invention that, instead of moving the entire wafer carrier 104 when changing the vertical displacement between the conductive surface and the workpiece surface influencing device, pressure, through using a fluid or a spring of some type, on a backside surface of a workpiece support is changed. As shown, the pressure can be applied using a pressure unit 160 that contains necessary mechanism for changing the applied pressure, as well as contains sensors for providing pressure information to the force monitoring unit 102. Control signals to the pressure unit 160 from the force monitoring unit 102 and pressure sensor signals from the pressure unit 150 to the force monitoring unit 102 are shown as being transmitted along signal lins 162. Signals from the pressure unit and/or the drivers can be used by the force monitoring unit to sense the change in pressure and/or displacment.

Th workpiece support will move up or down vertically within an otherwise stationery (at that time) housing of the wafer carrier 104, depending upon whether pressure is applied or removed, in order to effect the vertical displacement. U.S. patent application Ser. No. 09/472,523 filed on Dec. 27, 1999 entitled "Workpiece Carrier Head for Plating or Polishing" and assigned to the same assignee as the present invention further describes a pressure mechanism that can be used with such a wafer carrier 140 that can be used. Further, full face plating can be obtained applying the teachings provided in U.S. application Ser. No. 09/910,686 filed Jul. 20, 2001 entitled "Method of Sealing Wafer Backside for Full-Face Electrochemical Plating" and assigned to the same assignee as the present invention.

Although various preferred embodiments have been described in detail above, those skilled in the art will readily appreciate that many modifications of the exemplary embodiment are possible without materially departing from the novel teachings and advantages of this invention.

What is claimed is:

1. A method of monitoring force applied to a top conductive surface of a workpiece during an electrotreatment process that operates upon the conductive surface using an electro treatment solution, the method comprising the steps of:

performing an electrotreatment process on the conductive surface using a potential difference created between the conductive surface and an electrode during at least a portion of the electrotreatment process and the electro treatment solution disposed between a workpiece surface influencing device and the conductive surface of the workpiece, the electrotreatment process including maintaining relative motion between the workpiece surface influencing device and the conductive surface of the workpiece in the presence of physical contact between the workpiece surface influencing device and the conductive surface of the workpiece, whereby the relative motion in the presence of the physical contact cause the force between the workpiece surface influencing device and the conductive surface of the workpiece; and monitoring a signal obtained that corresponds to a torque value of a motor that is used to maintain the relative motion in the presence of the physical contact during the electro treatment process.

2. The method according to claim 1 further including the step of:

using the monitored signal that corresponds to the torque value to control the force during a subsequent portion of the electro treatment process.

3. The method of claim 2 wherein during the step of electrotreating there is included another portion of the electrotreatment process wherein there is not any physical contact between the workpiece surface influencing device and the conductive surface of the workpiece.

4. The method of claim 2 wherein during the step of electrotreating the force remains within a predetermined range.

5. The method of claim 2 wherein, during the step of using, a change in the monitored signal corresponding to the torque value that exceeds a determined threshold will cause the controlling of the force during the subsequent portion of the electrotreatment process by changing a displacement between the conductive surface and the workpiece surface influencing device.

6. The method of claim 5 wherein the displacement between the conductive surface and the workpiece surface influencing device is changed by altering a vertical position of a workpiece carrier to which the workpiece is attached.

7. The method of claim 6 wherein a full face of the conductive surface of the workpiece physically contacts the workpiece surface influencing device during a period of time with the relative motion.

8. The method of claim 5 wherein the displacement between the conductive surface and the workpiece surface influencing device is changed by altering a pressure on a backside surface of a workpiece support, the workpiece support being part of a workpiece carrier to which workpiece is attached.

9. The method of claim 8 wherein a full face of the conductive surface of the workpiece physically contacts the workpiece surface influencing device during a period of time with the relative motion.

10. The method of claim 2 wherein a full face of the conductive surface of the workpiece physically contacts the workpiece surface influencing device during a period of time with the relative motion.

11. The method of claim 2 wherein during the step of electrotreating the displacement varies during the electrotreatment process.

12. The method of claim 11 wherein during the step of electrotreating the displacement varies in a predetermined manner during the electrotreatment process.

13. The method of claim 12 wherein the displacement is less at a beginning of the electrotreatment process than at an end of the electro treatment process.

14. The method of claim 2 wherein the steps of monitoring and using are repeated a plurality of times during the electrotreatment process.

15. The method of claim 14 wherein the steps of monitoring and using are repeated at periodic intervals during the electrotreatment process.

16. The method of claim 2 wherein:
the step of electrotreating uses a spindle motor that rotates the workpiece to establish the relative movement between the workpiece surface influencing device and the conductive surface of the workpiece; and
the step of monitoring monitors the signal that corresponds to the torque value of the spindle motor.

17. The method of claim 16 wherein:
the step of electrotreating further includes using a lateral drive motor to create lateral movement between the conductive surface and the workpiece surface influencing device;
wherein the step of monitoring further monitors the signal that also includes a component corresponding to the torque value of the lateral drive motor; and
wherein the step of using also uses the monitored signal that includes the component corresponding to the torque value of the lateral drive motor.

18. The method of claim 2 wherein:
the step of electrotreating includes using a lateral drive motor to create lateral movement between the conductive surface and the workpiece surface influencing device; and
wherein the step of monitoring measures the torque value of the lateral drive motor.

19. The method of claim 16 wherein prior to the step of electrotreating there is included the step of moving the workpiece into a zero-touch position relative to the workpiece surface influencing device using a vertical drive motor.

20. The method of claim 19 wherein at the zero-touch position the spindle motor has a baseline torque value that can be represented as a baseline signal, and wherein during the step of using the monitored signal corresponding to the torque value is compared to the baseline signal to maintain the force between the conductive surface of the workpiece and the workpiece surface influencing device within a predetermined range.

21. The method of claim 2 wherein the electrotreatment process is an electrochemical mechanical deposition process and the solution is an electrolyte containing a conductor that is deposited onto the conductive surface of the workpiece in the presence of a depositing potential difference.

22. The method of claim 21 wherein the electrotreatment process further includes an electrochemical mechanical etching process that uses the electrolyte and during which conductive material is removed from the conductive surface of the workpiece in the presence of a removing potential difference that is opposite in polarity from the depositing potential difference.

23. The method of claim 22 wherein the steps of monitoring and using are repeated during both the electrochemical mechanical deposition process and the electrochemical mechanical etching process.

24. The method of claim 2 wherein the electrotreatment process is an electrochemical mechanical etching or polishing process and the solution is an etching or polishing solution that is used to remove conductive material from the conductive surface of the workpiece in the presence of a removing potential difference.

25. The method of claim 1 wherein during the step of electro treating there is included another portion of the electrotreatment process wherein there is not any physical contact between the workpiece surface influencing device and the conductive surface of the workpiece.

26. The method of claim 1 wherein during the step of electrotreating the force remains within a predetermined range during the electrotreatment process.

27. The method of claim 1 wherein during the step of electro treating the amount of physical contact varies during the electrotreatment process.

28. The method of claim 27 wherein during the step of electrotreating the determined amount of physical contact varies in a predetermined manner during the electrotreatment process.

29. The method of claim 28 wherein the amount of physical contact is less at a beginning of the electrotreatment process than at an end of the electrotreatment process.

30. The method of claim 1 wherein the step of monitoring is repeated a plurality of times during the electrotreatment process.

31. The method of claim 24 wherein the step of monitoring is repeated at periodic intervals during the electrotreatment process.

32. The method of claim 1 wherein:
the step of electrotreating uses a spindle motor that rotates the workpiece to establish the relative movement between the workpiece surface influencing device and the conductive surface of the workpiece; and
the step of monitoring measures the torque value of the spindle motor.

33. The method of claim 32 wherein:
the step of electro treating further includes using a lateral drive motor to create lateral movement between the conductive surface and the workpiece surface influencing device; and
wherein the step of monitoring further measures the torque value of the lateral drive motor.

34. The method of claim 1 wherein the electro treatment process is an electrochemical mechanical deposition process and the solution is an electrolyte containing a conductor that is deposited onto the conductive surface of the workpiece in the presence of a depositing potential difference.

35. The method of claim 34 wherein the electrotreatment process further includes an electrochemical mechanical etching process that uses the electrolyte and during which conductive material is removed from the conductive surface of the workpiece in the presence of a removing potential difference that is opposite in polarity from the depositing potential difference.

36. The method of claim 35 wherein the step of monitoring is repeated during both the electrochemical mechanical deposition process and the electrochemical mechanical etching process.

37. The method of claim 1 wherein the electrotreatment process is an electrochemical mechanical etching process and the solution is an etching solution that is used to remove conductive material from the conductive surface of the workpiece in the presence of a removing potential difference.

38. The method of claim 1 wherein a full face of the conductive surface of the workpiece physically contacts the workpiece surface influencing device during a period of time with the relative motion.

39. A method of operating upon a plurality of wafers each having a conductive surface using an electrotreatment solution comprising the steps of:

initializing an electrotreatment process, the step of initializing the electrotreatment process including obtaining a displacement between the conductive surface of each wafer and a workpiece surface influencing device that are in physical contact;

performing an electro treatment process on the conductive surface of a first group of the plurality of wafers using a potential difference created between the conductive surface of each wafer and an electrode during at least a portion of the electrotreatment process with the presence of the electrotreatment solution, the electrotreatment process including maintaining relative motion between the workpiece surface influencing device and the conductive surface of the workpiece in the presence of the displacement;

reinitializing an electro treatment process, the step of reinitializing the electrotreatment process including obtaining a reinitialized displacement; and performing the electrotreatment process on the conductive surface of a second group of the plurality of wafers using the potential difference created between the conductive surface of each wafer and the electrode during at least a portion of the electrotreatment process with the presence of the electrotreatment solution, the electro treatment process including, maintaining relative motion between the workpiece surface influencing device and the conductive surface of the workpiece in the presence of the reinitialized displacement amount.

* * * * *